(12) United States Patent
Cuypers et al.

(10) Patent No.: US 10,031,428 B2
(45) Date of Patent: Jul. 24, 2018

(54) GAS FLOW OPTIMIZATION IN RETICLE STAGE ENVIRONMENT

(71) Applicants: ASML Netherlands B.V., Veldhoven (NL); ASML Holding N.V., Veldhoven (NL)

(72) Inventors: Koen Cuypers, Lommel (BE); Marcelo Henrique De Andrade Oliveira, Amsterdam (NL); Marinus Jan Remie, Eindhoven (NL); Chattarbir Singh, Eindhoven (NL); Laurentius Johannes Adrianus Van Bokhoven, Veldhoven (NL); Henricus Anita Jozef Wilhemus Van De Ven, Echt (NL); José Nilton Fonseca Junior, Eindhoven (NL); Frank Johannes Jacobus Van Boxtel, Eindhoven (NL); Daniel Nathan Burbank, Ridgefield, CT (US); Erik Roelof Loopstra, Eindhoven (NL); Johannes Onvlee, 's-Hertogenbosch (NL); Mark Josef Schuster, Fairfield, CT (US); Robertus Nicodemus Jacobus Van Ballegoij, Eindhoven (NL); Christopher Charles Ward, Somerville, MA (US); Jan Steven Christiaan Westerlaken, Heesch (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 80 days.

(21) Appl. No.: 14/762,450

(22) PCT Filed: Feb. 20, 2014

(86) PCT No.: PCT/EP2014/053372
§ 371 (c)(1),
(2) Date: Jul. 21, 2015

(87) PCT Pub. No.: WO2014/128232
PCT Pub. Date: Aug. 28, 2014

(65) Prior Publication Data
US 2015/0355557 A1 Dec. 10, 2015

Related U.S. Application Data

(60) Provisional application No. 61/767,184, filed on Feb. 20, 2013, provisional application No. 61/916,031, filed on Dec. 13, 2013.

(51) Int. Cl.
*G03B 27/52* (2006.01)
*G03F 7/20* (2006.01)

(52) U.S. Cl.
CPC ...... *G03F 7/70933* (2013.01); *G03F 7/70358* (2013.01); *G03F 7/70633* (2013.01); *G03F 7/70725* (2013.01); *G03F 7/70866* (2013.01)

(58) Field of Classification Search
CPC ............ G03F 7/70358; G03F 7/70633; G03F 7/70716; G03F 7/70725; G03F 7/70866;
(Continued)

(56) References Cited

U.S. PATENT DOCUMENTS 5,877,843 A * 3/1999 Takagi ............... G03F 7/70358
355/30
6,153,877 A 11/2000 Ashida
(Continued)

FOREIGN PATENT DOCUMENTS

CN 102193337 A 9/2011
EP 1098226 A2 5/2001
(Continued)

OTHER PUBLICATIONS

English-Language Abstract for Japanese Patent Publication No. 2003-188085 A, published Jul. 4, 2003, 1 page.
(Continued)

*Primary Examiner* — Christina Riddle
(74) *Attorney, Agent, or Firm* — Sterne, Kessler, Goldstein & Fox P.L.L.C.

(57) ABSTRACT

A system is disclosed for reducing overlay errors by controlling gas flow around a patterning device of a lithographic apparatus. The lithographic apparatus includes an illumination system configured to condition a radiation beam. The lithographic apparatus further includes a movable stage comprising a support structure that may be configured to support a patterning device. The patterning device may be
(Continued)

configured to impart the radiation beam with a pattern in its cross-section to form a patterned radiation beam. In addition, the lithographic apparatus comprises a plate (410) positioned between the movable stage (401) and the projection system (208). The plate includes an opening (411) that comprises a first sidewall (411*a*) and a second sidewall (411*b*). The plate may be configured to provide a gas flow pattern (424) in a region between the movable stage and the projection system that is substantially perpendicular to an optical axis of the illumination system.

38 Claims, 8 Drawing Sheets

(58) Field of Classification Search
CPC .............. G03F 7/70875; G03F 7/70858; G03F 7/70933; G03F 7/70816; G03F 7/70825; G03F 7/70916; G03F 7/70925
USPC .......... 355/30, 52, 53, 55, 67–77; 250/492.1, 250/492.2, 492.22, 493.1, 548
See application file for complete search history.

(56) References Cited

U.S. PATENT DOCUMENTS

| | | | |
|---|---|---|---|
| 6,542,220 B1* | 4/2003 | Schrijver | G03F 7/70716 355/53 |
| 2002/0018190 A1* | 2/2002 | Nogawa | G03F 7/70525 355/30 |
| 2002/0045113 A1 | 4/2002 | Pril et al. | |
| 2002/0057422 A1* | 5/2002 | Arakawa | G03F 7/70525 355/30 |
| 2002/0180940 A1 | 12/2002 | Schrijver et al. | |
| 2002/0191163 A1* | 12/2002 | Hasegawa | G03F 7/70933 355/30 |
| 2002/0191166 A1 | 12/2002 | Hasegawa et al. | |
| 2003/0006380 A1 | 1/2003 | Van Empel et al. | |
| 2003/0169407 A1 | 9/2003 | Hasegawa et al. | |
| 2003/0228239 A1 | 12/2003 | Meyer et al. | |
| 2005/0074352 A1* | 4/2005 | Luo | G03F 1/64 417/572 |
| 2006/0017895 A1* | 1/2006 | Sogard | G03F 7/70875 355/30 |
| 2006/0197932 A1 | 9/2006 | Shima | |
| 2007/0079525 A1 | 4/2007 | Sogard | |
| 2011/0228239 A1 | 9/2011 | Gosen et al. | |
| 2013/0016331 A1* | 1/2013 | Exler | G03F 7/70266 355/67 |
| 2013/0021594 A1 | 1/2013 | Umemura et al. | |
| 2013/0070220 A1 | 3/2013 | Bessems et al. | |
| 2015/0168854 A1 | 6/2015 | Westerlaken et al. | |
| 2015/0241796 A1 | 8/2015 | Ebert, Jr. et al. | |
| 2015/0301456 A1 | 10/2015 | Ebert, Jr. et al. | |

FOREIGN PATENT DOCUMENTS

| | | |
|---|---|---|
| EP | 1 207 425 A2 | 5/2002 |
| JP | 2002-151400 A | 5/2002 |
| JP | 2003-188085 A | 7/2003 |
| JP | 2005-340825 A | 12/2005 |
| JP | 2010-283015 A | 12/2010 |
| JP | 2011-199284 A | 10/2011 |
| JP | 2011-237718 A | 11/2011 |
| JP | 2011-249620 A | 12/2011 |
| WO | WO 2013/174646 A1 | 11/2013 |

OTHER PUBLICATIONS

English-Language Abstract for Japanese Patent Publication No. 2011-249620 A, published Dec. 8, 2011; 1 page.
International Search Report directed to related International Patent Application No. PCT/EP2014/053372, dated Jul. 24, 2014; 5 pages.
International Preliminary Report and Patentability and Written Opinion of the International Searching Authority directed to related International Patent Application No. PCT/EP2014/053372, dated Aug. 25, 2015; 5 pages.
English-Language Abstract, for Japanese Patent Publication No. JP2015151400, published May 24, 2002; 2 pages.
English-Language Abstract for Japanese Patent Publication No. JP2005340825, published Dec. 8, 2005; 2 pages.
English-Language Abstract for Japanese Patent Publication No. JP2010283015, published Dec. 16, 2010; 1 page.
English-Language Abstract for Japanese Patent Publication No. JP2011237718, published Nov. 24, 2011; 2 pages.
English-Language Abstract for Chinese Patent Publication No. CN102193337, published Sep. 21, 2011; 1 page.
Japanese Office Action, Notification of Reasons for Refusal directed to related Japanese Patent Publication No. JP2016508236, dated Jul. 12, 2016; 3 pages.
English-Language Abstract for Japanese Patent Publication No. JP2011199284, published Oct. 6, 2011; 1 page.
International Preliminary Report on Patentability directed to related International Patent Application No. PCT/EP2015/050936, dated Aug. 23, 2016; 5 pages.
International Search Report and Written Opinion, of the International Search Authority directed to related Patent Application No. PCT/EP2015/050936, dated Mar. 23, 2015; 8 pages.
Chinese Office Action directed to related Chinese Patent Publication No. CN201480009319.9, dated Jun. 24, 2016; 12 pages.

\* cited by examiner

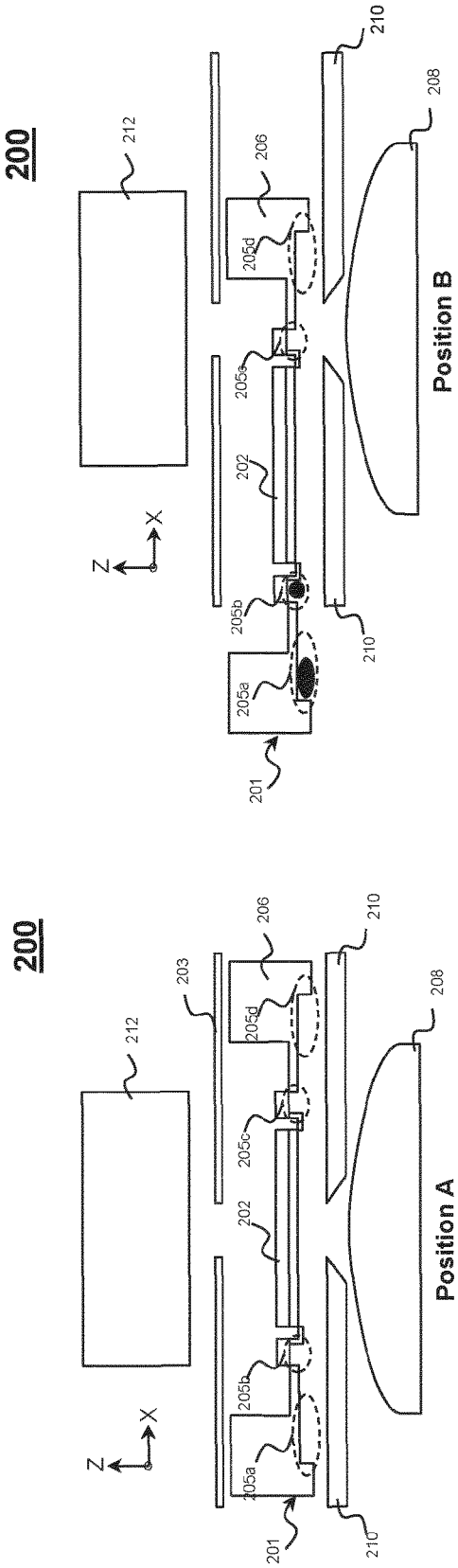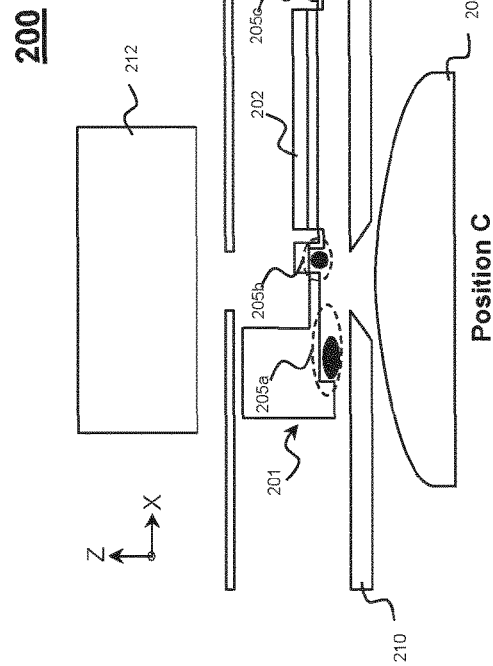

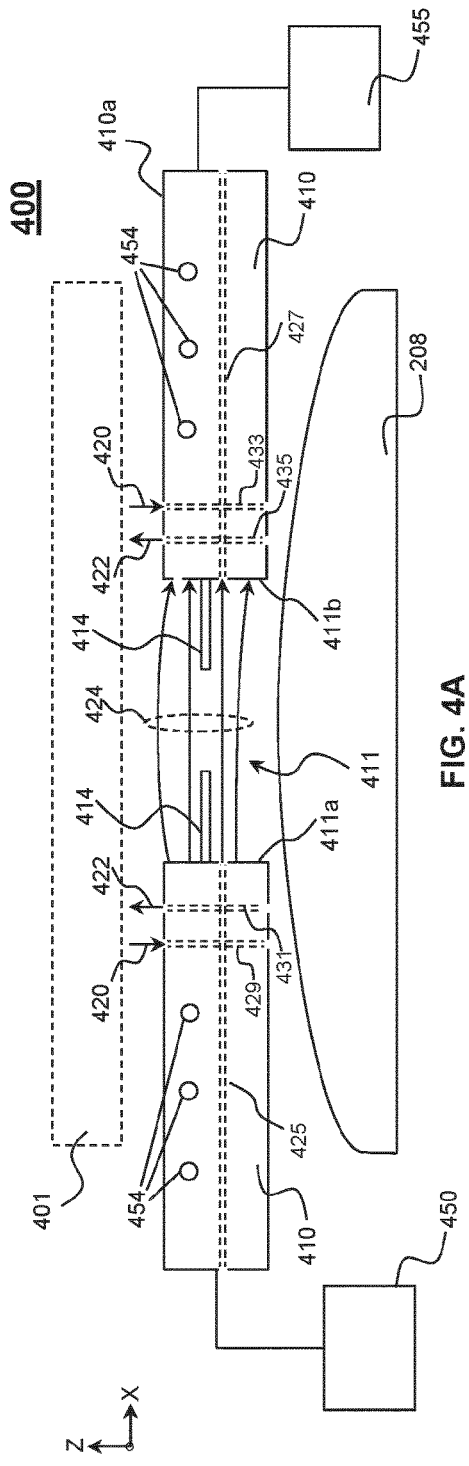
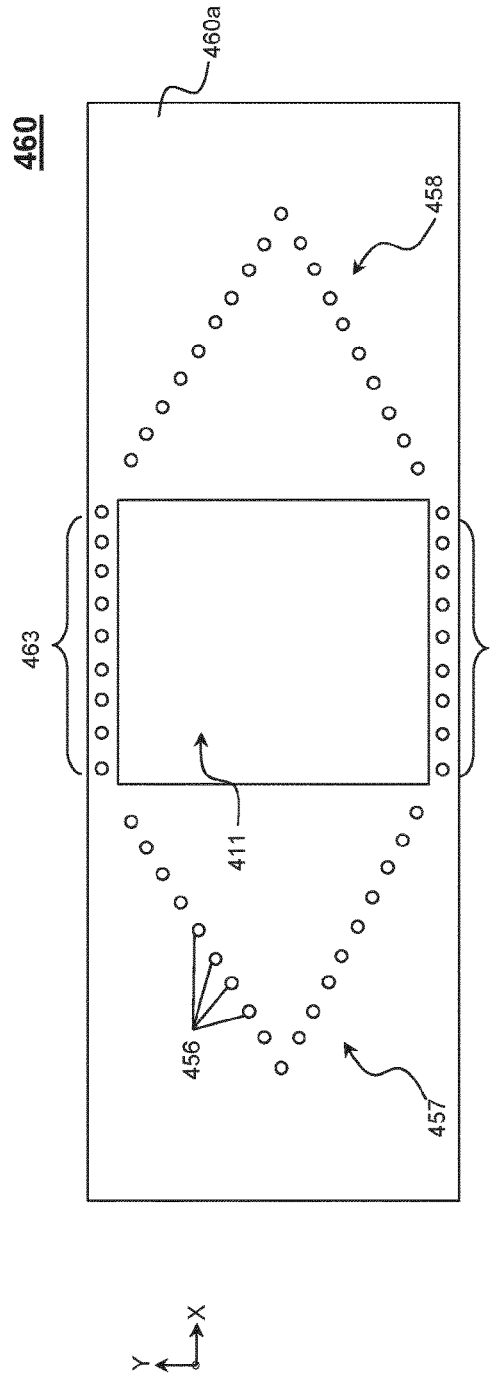

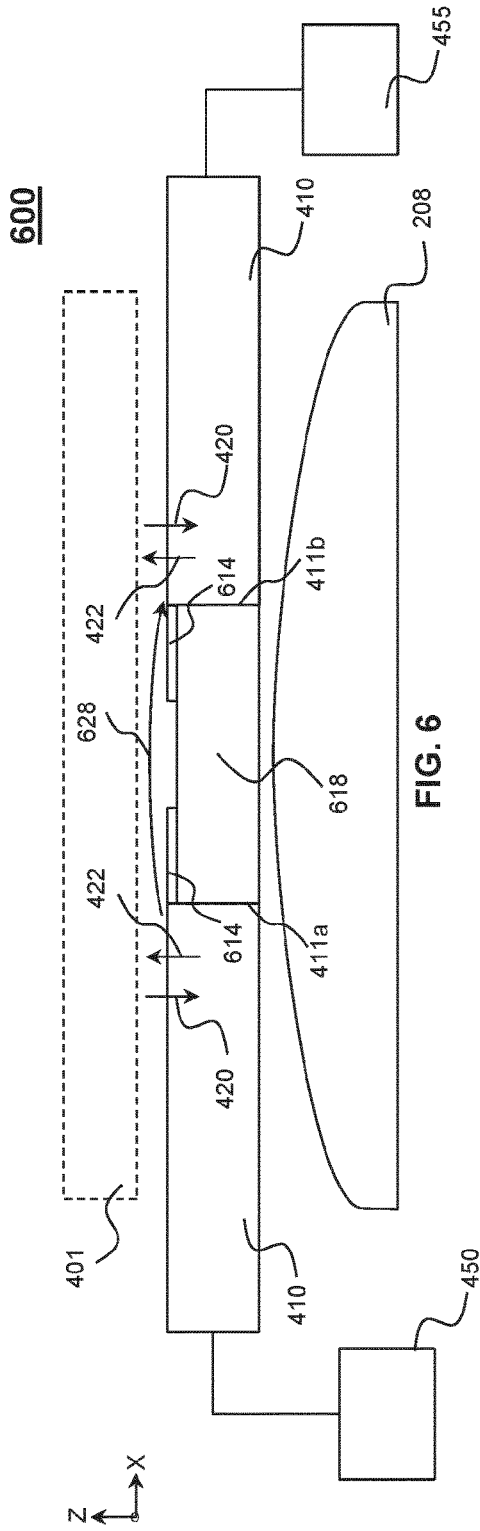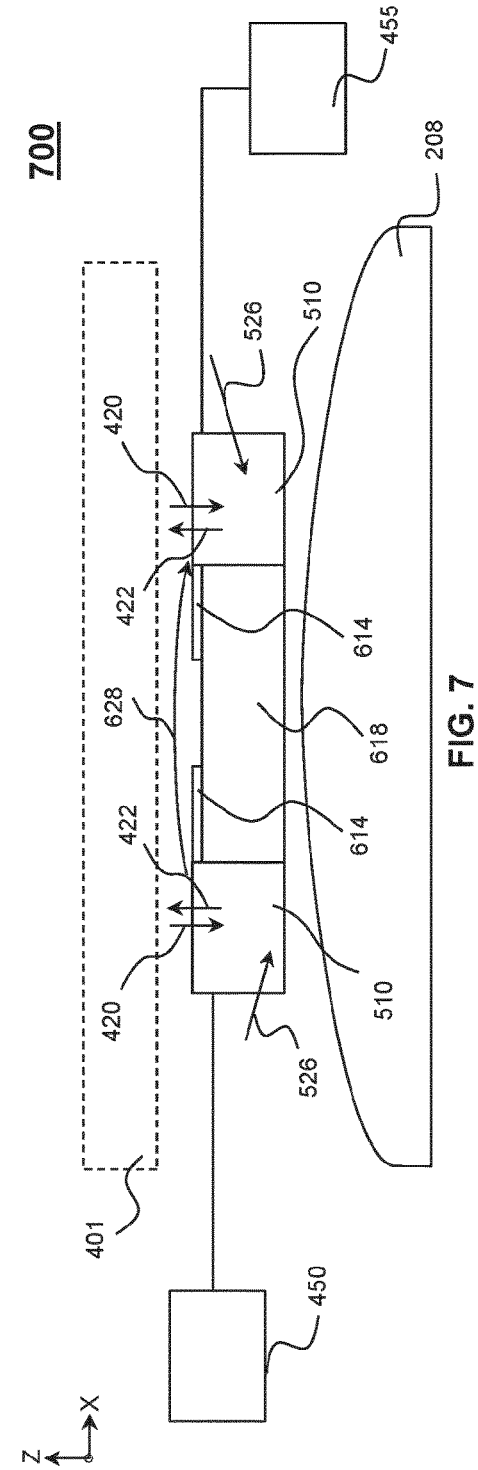

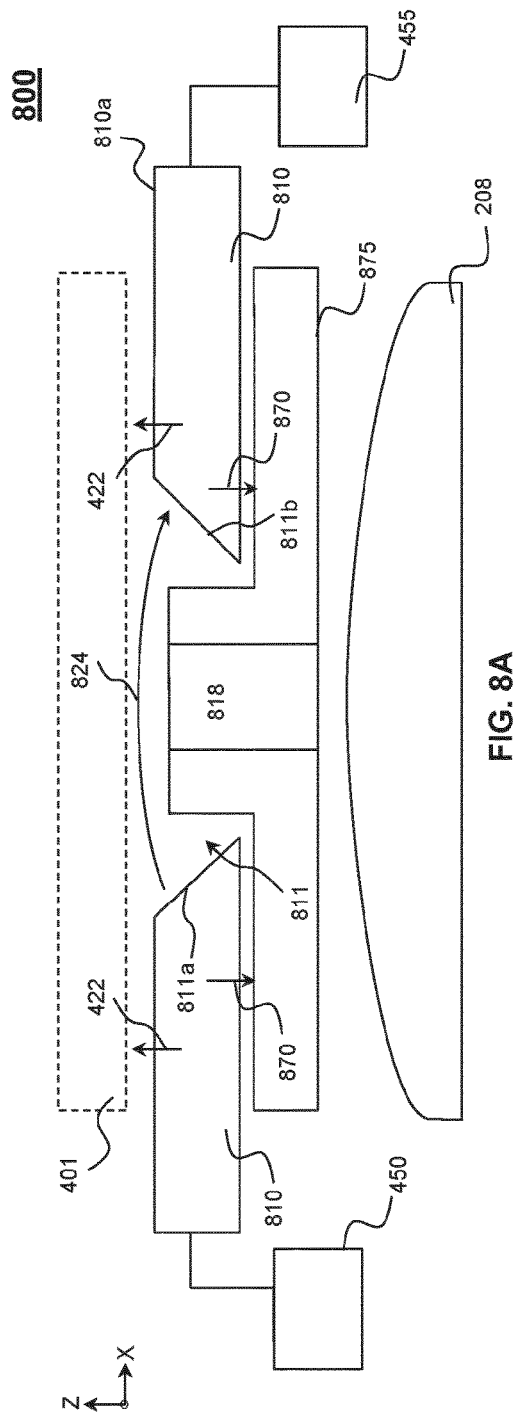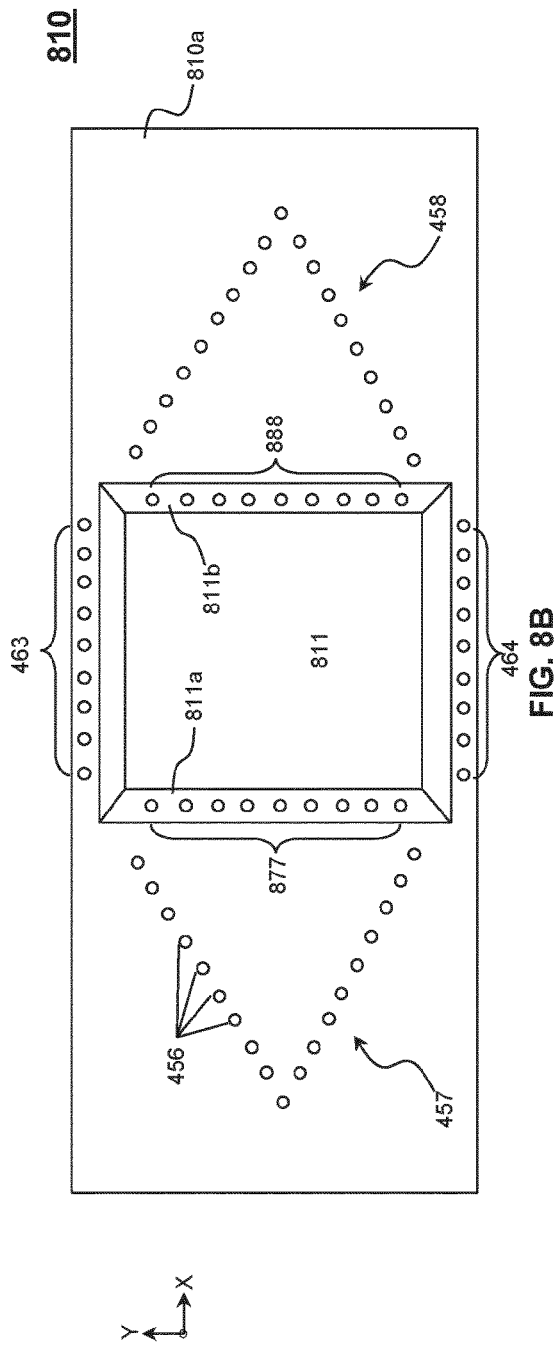

GAS FLOW OPTIMIZATION IN RETICLE STAGE ENVIRONMENT

CROSS-REFERENCE TO RELATED APPLICATIONS

This application claims the benefit of U.S. provisional application 61/767,184 which was filed on 20 Feb. 2013 and of U.S. provisional application 61/916,031 which was filed on 13 Dec. 2013, and which are incorporated herein in its entirety by reference.

FIELD

The present invention relates to various shapes and configurations of elements in a movable stage environment, such as a reticle stage environment that are designed, for example, to reduce chaotic and unsteady gas flow in the movable stage environment and to reduce overlay errors.

RELATED ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction), while synchronously scanning the substrate parallel or anti-parallel to this direction.

Maintaining cleanliness of the reticle stage environment includes ensuring the lifetime of optical elements at a lens top side of a projection system near the reticle stage by providing an ultra-clean gas environment. This clean environment reduces contamination (both cleanable and non-cleanable) on the optical elements. Reducing contamination improves optical uniformity and reduces straylight degradation. However, providing a flow of purge gas around the lens top underneath the reticle stage can create alignment distortions due to turbulent flow and pockets of stagnant gas created by a geometry of a bottom surface of the reticle stage.

SUMMARY

Accordingly, there is a need for improved systems and methods for addressing distortions and errors caused by gas flow underneath the reticle stage.

In an embodiment, a lithographic apparatus includes an illumination system that can be configured to condition a radiation beam. The lithographic apparatus further includes a movable stage comprising a support structure that may be configured to support a patterning device. The patterning device may be configured to impart the radiation beam with a pattern in its cross-section to form a patterned radiation beam. The lithographic apparatus further includes a substrate table configured to hold a substrate and a projection system configured to project the patterned radiation beam onto a target portion of the substrate. In addition, the lithographic apparatus comprises a plate positioned between the movable stage and the projection system. The plate includes a first surface and a second surface, wherein the second surface is substantially parallel and opposite to the first surface. The plate further includes an opening that extends from the first surface to the second surface and comprises a first sidewall and a second sidewall. The plate may be configured to provide a gas flow pattern within a region between the movable stage and the projection system. The gas flow pattern may be substantially perpendicular to an optical axis of the illumination system.

According to another embodiment, a lithographic apparatus includes an illumination system that can be configured to condition a radiation beam. The lithographic apparatus further includes a movable stage comprising a support structure that may be configured to support a patterning device. The patterning device may be configured to impart the radiation beam with a pattern in its cross-section to form a patterned radiation beam. The lithographic apparatus further includes a substrate table configured to hold a substrate and a projection system configured to project the patterned radiation beam onto a target portion of the substrate. In addition, the lithographic apparatus comprises a plate positioned between the movable stage and the projection system. The plate includes an opening configured to provide an optical path between the illumination system and the projection system. The plate may be configured to provide a gas flow pattern that is substantially perpendicular to an optical axis of the illumination system.

Yet in another embodiment, a lithographic apparatus includes an illumination system that can be configured to condition a radiation beam. The lithographic apparatus further includes a movable stage comprising a support structure that may be configured to support a patterning device. The patterning device may be configured to impart the radiation beam with a pattern in its cross-section to form a patterned radiation beam. The lithographic apparatus further includes a substrate table configured to hold a substrate and a projection system configured to project the patterned radiation beam onto a target portion of the substrate. In addition, the lithographic apparatus comprises a plate positioned between the movable stage and the projection system. The plate may be configured to provide a path for supply gas to be introduced into a region between the plate and the movable stage in order to prevent external gas from entering the region. The plate includes an opening configured to provide an optical path between the illumination system and the projection system.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 3A-3C are schematic illustrations of cross sectional views of a movable stage at various positions;

FIG. 4A is a schematic illustration of a cross sectional view of a portion of a lithographic apparatus, according to an embodiment of the invention;

FIG. 4B is a schematic illustration of a top view of a lens top environment (LTE) plate, according to an embodiment of the invention;

FIG. 6 is a schematic illustration of a cross sectional view of a portion of a lithographic apparatus, according to an embodiment of the invention;

FIG. 7 is a schematic illustration of a cross sectional view of a portion of a lithographic apparatus, according to an embodiment of the invention;

FIG. 8A is a schematic illustration of a cross sectional view of a portion of a lithographic apparatus, according to an embodiment of the invention; and FIG. 8B is a schematic illustration of a top view of an LTE plate, according to an embodiment of the invention.

Figure 1A:
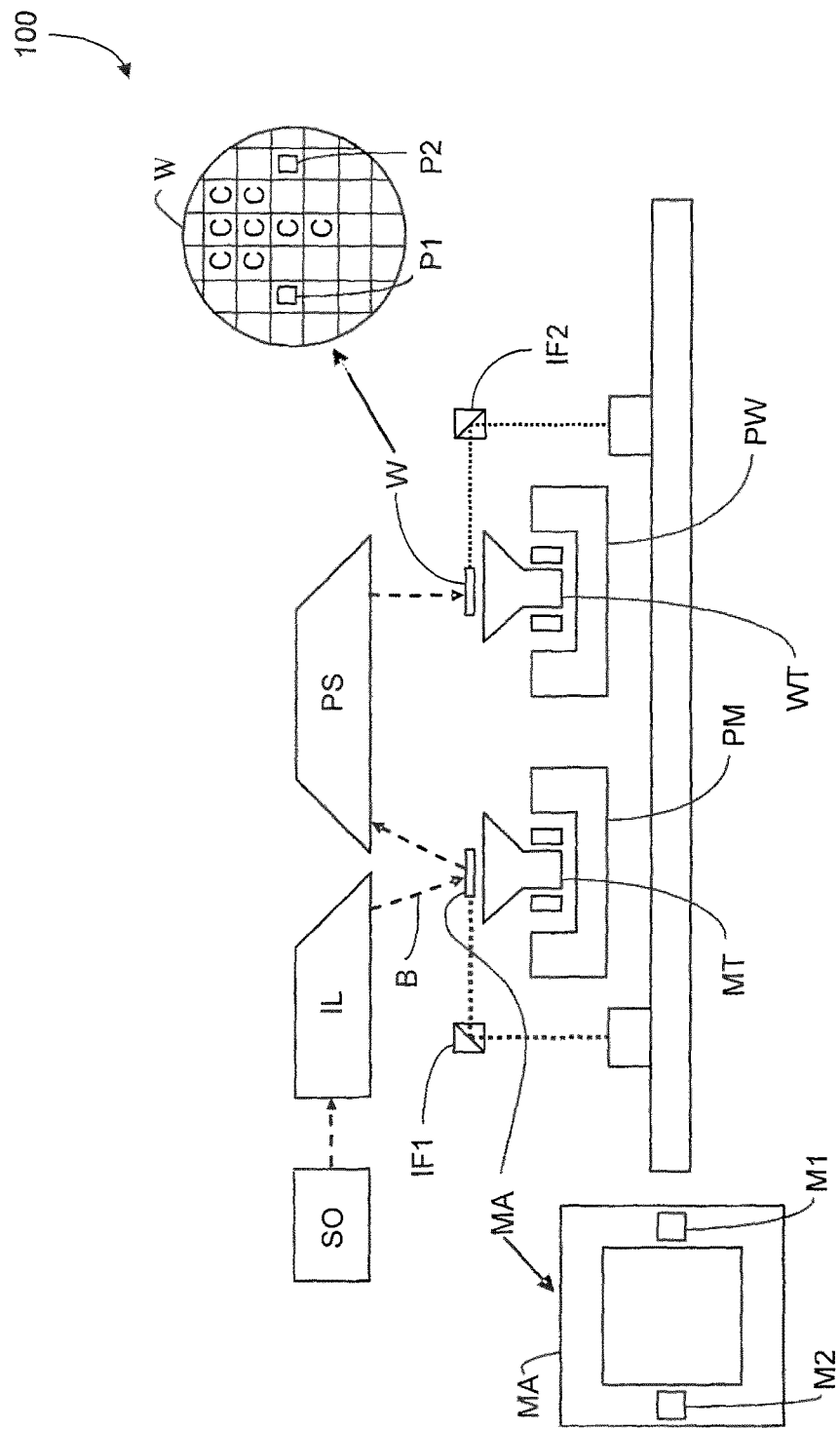
FIG. 1A is a schematic illustration of a reflective lithographic apparatus according to an embodiment of the invention.

The features and advantages of the present invention will become more apparent from the detailed description set forth below when taken in conjunction with the drawings. In the drawings, like reference numbers generally indicate identical, functionally similar, and/or structurally similar elements. Generally, the drawing in which an element first appears is typically indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1B:
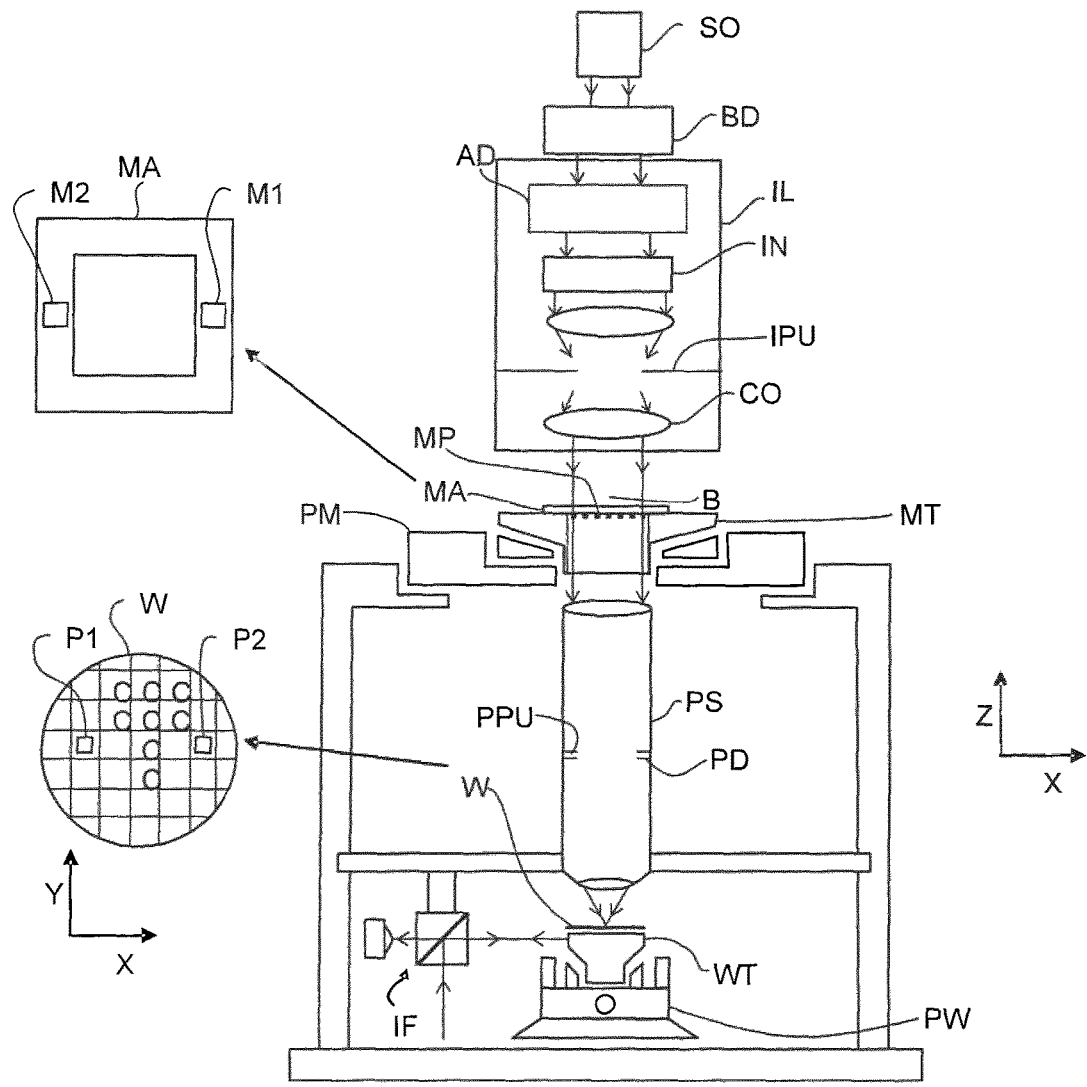
FIG. 1B is a schematic illustration of a transmissive lithographic apparatus according to an embodiment of the invention.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions.

The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), and thin-film magnetic heads. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools. Further, the substrate can be processed more than once, for example, in order to create a multi-layer IC, so that the term substrate used herein can also refer to a substrate that already contains one or multiple processed layers.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

Figure 2:
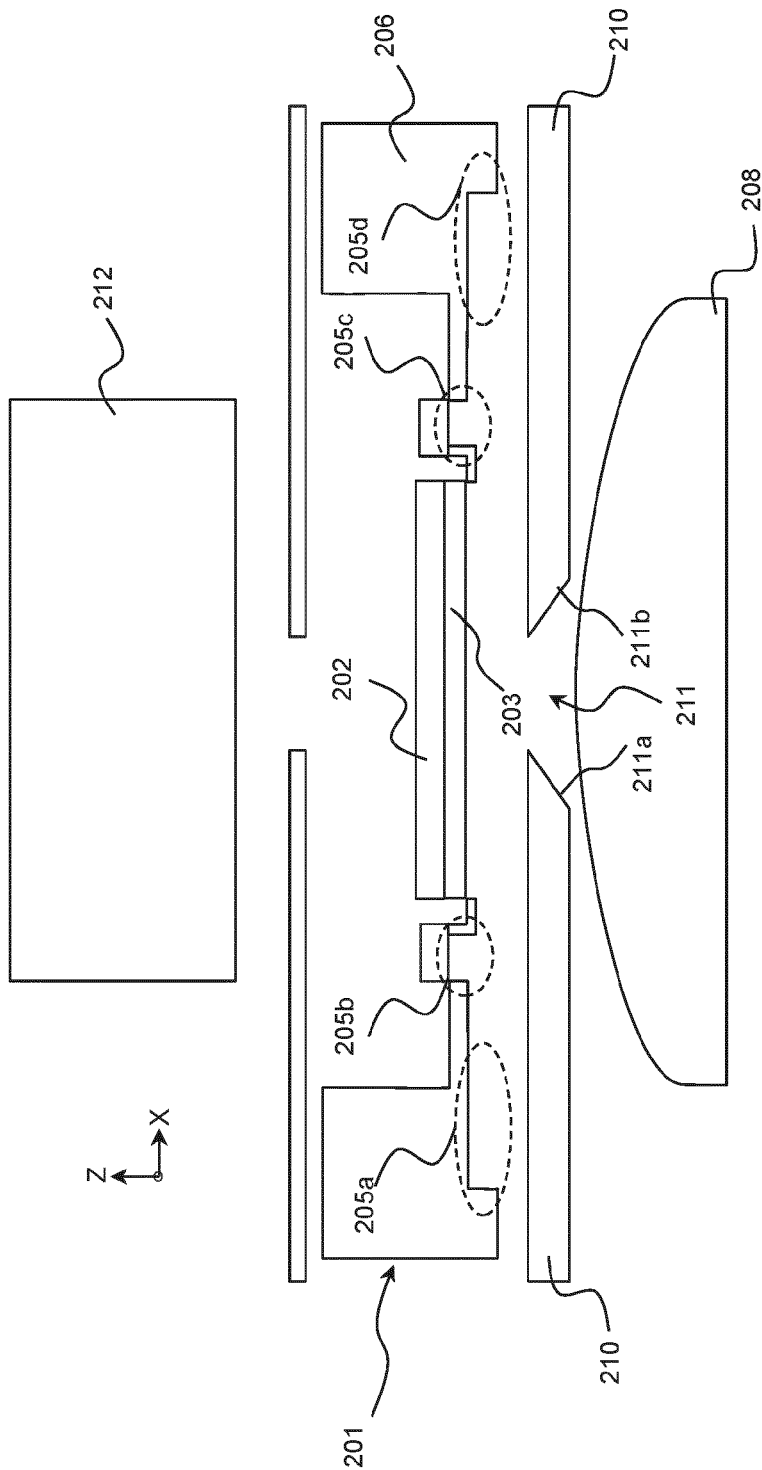
FIG. 2 is a schematic illustration of a cross sectional view of a portion of a lithographic apparatus.

FIG. 2 illustrates a cross-sectional view of a portion of a lithographic apparatus 200. In one example, lithographic apparatus 200 may be similar to lithographic apparatus 100 and 100', as described above, in structure and function. Lithographic apparatus 200 may include a movable stage 201, a lens top 208, an LTE plate 210, and an illumination system 212. LTE may be referred to herein as a volume of space between movable stage 201 and lens top 208.

Movable stage 201 may include a support structure 203 to support a patterning device 202, e.g., a reticle or mask. Support structure 203 may be coupled to an actuating device 206, e.g., a short stroke actuator, long stroke actuator or a combination thereof.

Lens top 214 may represent an optical element within a projection system, such as those described with respect to FIGS. 1A and 1B.

LTE plate 210 may comprise an opening 211 having slanted sidewalls 211a and 211b. Opening 211 may provide an optical path between illumination system 212 and lens top 208. In an example, LTE plate 210 may be configured as a purge plate and positioned to provide a purged volume between movable stage 201 and lens top 208. The purged volume may comprise a region within opening 211 and may provide a conditioned gas-environment through which imaging radiation may travel from illumination system 212 to lens top 208, according to an example. The conditioning of the gas-environment intends to avoid or reduce turbulence in the gas. Turbulence can be caused in the gas-environment by, e.g., temperature gradients and/or pressure waves induced by moving parts of the lithographic apparatus.

The purged volume may have a continuous flow of gas that may be created by supplying gas from openings on sidewall 211a and extracting the supplied purge gas through openings on sidewall 211b. Due to the slanted geometry of sidewalls 211a and 211b, vertical flow components parallel to an optical axis of illumination system 212 may be present in the continuous flow of gas. The presence of vertical flow components may create a gas flow pattern in the purged volume that is not substantially perpendicular to an optical axis of illumination system 212. Such gas flow patterns in the purged volume beneath movable stage 201 may contribute to chaotic unsteady gas flow during scanning of movable stage 201, producing overlay errors, e.g., non-moving average overlay errors. Non-moving average overlay error is an overlay component that is sometimes defined as the scanner-filter residual; in essence a noise that remains after row-based filtering. It may be associated with local overlay effects, or intra-field overlay performance. In one example, non-moving average overlay errors are attributed to variations in exposure fields or exposure rows. Additionally, or alternatively, the errors may be caused by alignment noise.

Additionally or alternatively, a non-flat geometry of a bottom surface of movable stage 201 may also contribute to the non-moving average overlay errors. As illustrated in FIGS. 2 and 3A-C, the non-flat bottom surface of movable stage 201 may have cavities 205a-d, which may contribute to the non-moving average overlay errors. Cavities 205a-d may carry non-conditioned gas from external environment and transport into LTE during scanning of movable stage 201 along X-axis, as illustrated in FIGS. 3A-C. It should be noted that movable stage 201 may also scan along Y-axis, even though not illustrated in the present disclosure. FIG. 3B illustrates that movable stage 201 may take non-conditioned gas into cavities 205a and 205b from external environment when movable stage 201 scans from position A to B. This non-conditioned gas may then be transported into LTE (as shown in FIG. 3C) when movable stage 201 scans from position B to C. As this non-conditioned gas has a refractive index different from the conditioned gas provided between movable stage 201 and lens top 208, imaging radiation beam may experience a varying optical path length while traversing from illumination system 212 towards lens top 208, which may lead to the non-moving average overlay errors. The non-conditioned gas from outside may also contaminate LTE. Additionally, the external gas carried within cavities 205a-d may cause turbulence in the gas flow in the purged volume, resulting in unsteady gas flow and non-uniform temperature distribution in LTE. Such temperature distribution may allow temperature of gas in LTE to diverge from that of a conditioned gas environment.

Example Embodiments of Lens Top Environment Plate Design and Configuration

The following embodiments may substantially eliminate the non-moving average overlay errors caused by gas flow issues with moveable stage 201, as discussed above.

FIG. 4A illustrates a cross sectional view of a portion of lithographic apparatus 400, according to an embodiment. In an example of this embodiment, lithographic apparatus 400 may be similar to lithographic apparatus 200 (as described with respect to FIGS. 2 and 3A-3C) in structure and function. Therefore, only differences between lithographic apparatus 200 and 400 are to be discussed. Lithographic apparatus 400 may include a movable stage 401 and an LTE plate 410. Movable stage 401 may be similar to movable stage 201 in structure and function, as described above with respect to FIGS. 2 and 3A-C. It should be noted that movable stage 401 may have a non-flat bottom surface similar to that of movable stage 201, even though a flat bottom surface of movable stage 401 is illustrated in FIG. 4A for the sake of simplicity.

According to an example of this embodiment, LTE plate 410 may include an opening 411 having sidewalls 411a and 411b that are substantially parallel to each other and substantially perpendicular to a scanning direction (e.g., X-direction) of movable stage 401. LTE plate 410 may further include gas channels 425 and 427 terminating at openings on sidewalls 411a and 411b.

The geometry of sidewalls 411a and 411b may help to create a gas flow pattern 424 that is substantially perpendicular to the optical axis and substantially parallel to a scanning direction of movable stage 401. Formation of gas flow pattern 424 across opening 411 may include supplying of a gas (e.g., purge gas) through openings on sidewall 411a, and may optionally include extracting the supplied gas and/or non-conditioned gas in LTE through openings on sidewall 411b. The supplied and extracted gas may be directed through LTE by gas channels 425 and 427, respectively. Gas flow pattern 424 may help to mitigate problems relating to, for example, a gas flow having vertical flow components, as discussed above.

It should be noted that even though gas flow pattern 424 is shown to be along X-axis scanning direction, gas flow patterns may be created along Y-axis scanning direction between another pair of oppositely facing sidewalls of opening 411 that are substantially perpendicular to sidewalls 411a and 411b without departing from the spirit and scope of the present disclosure, as is understood by a skilled artisan.

In another example, LTE plate 410 may include gas extraction paths 429 and 433 through which non-conditioned gas transported into LTE (as described above with respect to FIGS. 3A-C) may be extracted in a direction illustrated by arrows 420.

Yet in another example, LTE plate 410 may include gas supply paths 431 and 435 terminating at openings on LTE plate top surface 410a. Gas supply paths 431 and 435 may be configured to direct a gas provided by one or more gas knife systems (not shown) into regions between moveable stage 401 and LTE plate 410. The gas knife systems may be coupled to LTE plate 410. Arrows 422 represent the direction of gas supplied by the gas knife systems to block non-conditioned gas from entering LTE and/or to deflect non-conditioned gas that may have entered into the LTE during scanning of movable stage 401 as described above with respect to FIGS. 3A-C. It should be noted that gas provided by a gas knife system may exit gas supply paths (e.g., gas supply paths 431 and 435) along direction 422 with a higher exit velocity than gas exiting openings on sidewall 411a.

It is understood by a skilled artisan that LTE plate 410 may include gas supply paths or gas extraction paths, or a combination thereof. Additionally, it should be understood that gas channels 425 and 427, gas extraction paths 429 and 433, and gas supply paths 431 and 435 are not limited to only having a geometry as illustrated in FIG. 4A and that LTE plate 410 may include any number of gas channels and gas paths.

LTE plate 410 may further include fluid channels 454 running through LTE plate 410 in Y-direction as illustrated in FIG. 4A, according to an example. Fluid channels 454 may be configured to carry thermally conditioned fluid (e.g., liquids or gas) to help regulate a temperature of LTE plate 410 to a desired temperature. Temperature regulation of LTE plate 410 may include absorbing excess heat by the thermally conditioned fluid from LTE plate 410. Excess heat may have transferred to LTE plate 410, e.g., by convection or by radiation, from, for example, movable stage 401, projection system PS, and/or other systems of lithographic apparatus 400 during their operation. Presence of excess heat in LTE plate 410 may heat up the conditioned gas flowing through gas channels (e.g., channels 425 and 427) and gas paths (e.g., supply paths 431 and 435, extraction paths 429 and 433) and allow a temperature of the gas in LTE to locally diverge from that of the conditioned gas environment. This divergence may lead to overlay errors as discussed above with respect to FIGS. 3A-C. Even though fluid channels 454 have been illustrated along the Y-direction, it is understood by a skilled artisan that fluid channels may be oriented along different directions in LTE plate 410.

Lithographic apparatus 400 may further include a gas system 450 and a fluid conditioning system 455 coupled to LTE plate 410, according to an embodiment. Gas system 450 may be configured to provide gas supply through LTE 410 via, for example, channels 425 and supply paths 431 and 435 as described above. Additionally or alternatively, gas system 450 may be configured to provide gas extraction via, for example, channel 427 and extraction paths 429 and 433 as described above. The gas knife system discussed above may be a sub-system of gas system 450, according to an example of this embodiment.

Fluid conditioning system 455 may be configured to provide a constant or controlled, varying flow of a thermally conditioned fluid through fluid channels 454 of LTE plate 410 to regulate the temperature of LTE plate 410, according to an example. The fluid is conditioned to a desired temperature by fluid conditioning system 455 before entering LTE plate 410.

In another example of this embodiment, LTE plate 410 may include slit reducers 414 positioned at about half the height of purged volume within opening 411. The radiation beam passing through opening 411 may be shaped and trimmed using slit reducers 414.

FIG. 4B illustrates a top view of a LTE plate 460 that can be implemented as part of lithographic apparatus 100, 100', 200, or 400, according to an embodiment. In an example, LTE plate 460 may be similar to LTE plate 410 (as described with respect to FIG. 4) in structure and function. Therefore, only differences between LTE plate 410 and LTE plate 460 are to be discussed. In an example of this embodiment, LTE plate 460 includes openings 456 on its top surface 460*a* that faces the bottom surface of a movable stage (e.g., movable stage 401). Openings 456 may be configured as outlets of gas supply paths (not shown) running through LTE plate 460, according to an example. Gas supply paths of LTE plate 460 may be similar in structure and function to gas supply paths 431 and 435 of LTE plate 410 and may be coupled to one or more gas knife systems, as described with respect to FIG. 4A.

According to various examples, openings 456 may be arranged in various array configurations. In one example, openings 456 may be arranged in substantially V-shaped arrays 457 and 458 (as shown in FIG. 4B) with each V-shaped array being located on either side of opening 411 of LTE plate 460. Each specific one of V-shaped arrays 457 and 458 has a specific line of symmetry. Each specific one of V-shaped arrays 457 and 458 may be positioned such that the specific line of symmetry is along a scanning direction (e.g., X-direction) of a movable stage (e.g., movable stage 401) and is substantially parallel to, and aligned with, a line of symmetry of opening 411. In addition, the apex of each of V-shaped arrays 457 and 458 points away from opening 411. Such V-shaped arrays 457 and 458 may allow blocking of non-conditioned gas from entering the LTE during a scanning operation of the movable stage and/or may allow deflecting of non-conditioned gas that entered the LTE from the scanning direction. Additionally or alternatively, LTE plate 460 may include similar V-shaped arrays of gas extraction path inlets (not shown) on its top surface 460*a*. The gas extraction paths may be similar in structure and function to gas extraction paths 429 and 433 of LTE plate 410, as described with respect to FIG. 4A. It should be noted that LTE plate 460 may include any number of V-shaped arrays of openings 456. Also, opening 411 is not limited to the geometry illustrated in FIG. 4B but can be any type of geometric shape, as is understood by a skilled artisan.

In another example, openings 456 may be arranged in substantially linear arrays 463 and 464 with each specific one of the linear arrays being located on a specific side of opening 411. Linear arrays 463 and 464 may be oriented along a scanning direction (e.g., X-direction) of the movable stage and may allow blocking of non-conditioned gas from entering LTE and/or may allow deflecting of non-conditioned gas that entered LTE from a non-scanning direction (e.g., Y-direction) of the movable stage.

Figure 5:
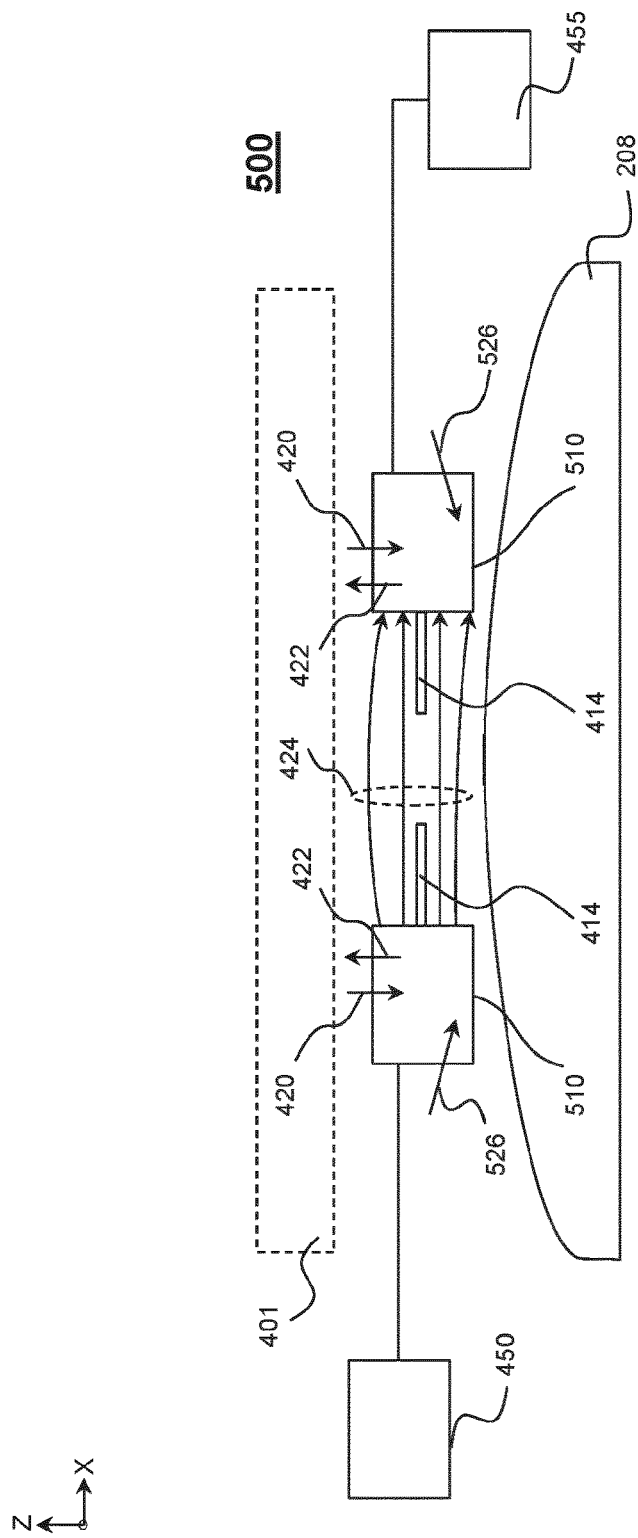
FIG. 5 is a schematic illustration of a cross sectional view of a portion of a lithographic apparatus, according to an embodiment of the invention.

FIG. 5 illustrates a portion of lithographic apparatus 500 according to an embodiment. In an example of this embodiment, lithographic apparatus 500 may be similar to lithographic apparatus 400 (as described with respect to FIG. 4A) in structure and function. Therefore, only differences between lithographic apparatus 400 and 500 are to be discussed. In an example of this embodiment, lithographic apparatus may include an LTE plate 510 that have a lateral dimension smaller in comparison to a lateral dimension of LTE 410 (as shown in FIG. 4A). The reduced lateral dimension of LTE 510 may provide a reduced area between movable stage 401 and LTE plate 510 compared to that between movable stage 401 and LTE plate 410. This reduced area may help to reduce volume of non-conditioned gas dragged into LTE by movable stage 401 and as a result may help to mitigate problems relating to, for example, non-conditioned gas in LTE, as discussed above. In an example of this embodiment, extraction of non-conditioned gas surrounding LTE plate 510 may be provided by gas system 450 in a direction illustrated by arrows 526.

FIG. 6 illustrates a portion of lithographic apparatus 600 according to an embodiment. In an example of this embodiment, lithographic apparatus 600 may be similar to lithographic apparatus 400 (as described with respect to FIG. 4A) in structure and function. Therefore, only differences between lithographic apparatus 400 and 600 are to be discussed. Lithographic apparatus 600 may include an optical element 618 and slit reducers 614, in an example of this embodiment. Optical element 618 may be positioned in the LTE within opening 411 and be in substantial contact with sidewalls 411*a* and 411*b* such that it substantially blocks opening 411 of LTE plate 410. Optical element 618 may be coupled to LTE plate 410 or a projection system such as those described with respect to FIGS. 1A and 1B. The placement of optical element 618 within opening 411 may reduce the volume to be purged in LTE, and as a result mitigate problems relating to, for example, gas flows in purged volume of LTE, as discussed above. Due to the presence of optical element 618 within opening 411, a gas flow substantially perpendicular to the optical axis only needs to be created between movable stage 401 and optical element 618, as shown with arrow 628. Optical element 618 is configured to be transmissive to radiation from illumination systems such as those described with respect to FIGS. 1A, 1B, and 2, according to an example. In an embodiment, slit reducers 614 may be coupled to LTE plate 410 and positioned above optical element 618 within opening 411.

FIG. 7 illustrates a portion of lithographic apparatus 700 according to an embodiment. In an example of this embodiment, lithographic apparatus 700 may be similar to lithographic apparatus 500 and 600 (as described with respect to FIGS. 5 and 6) in structure and function. The configuration of components in LTE of lithographic apparatus 700 provides both the reduced area between movable stage 401 and LTE plate 510 and the reduced purged volume due to optical element 618, as discussed above with respect to FIGS. 5 and 6, respectively.

It is to be appreciated that configuration of components between movable stage 401 and lens top 208, as illustrated in FIGS. 6 and 7 may have a greater contribution in reducing the non-moving average overlay errors than that illustrated in FIGS. 4 and 5. This may be primarily due to lithographic apparatus 600 and 700 having a shorter optical path length in a gas environment compared to that of lithographic apparatus 400 and 500.

FIG. 8A illustrates a portion of lithographic apparatus 800 according to an embodiment. In an example of this embodiment, lithographic apparatus 800 may be similar to lithographic apparatus 400 (as described with respect to FIG. 4A) in structure and function. Therefore, only differences between lithographic apparatus 400 and 800 are to be discussed. Lithographic apparatus 800 may include an LTE plate 810, an optical element 818, and a support system 875 configured to provide support to optical element 818, in an example of this embodiment.

In an example, LTE plate 810 may be similar to LTE plate 410 in structure and function, so only differences between LTE plate 810 and LTE plate 410 are discussed. LTE plate 810 comprises an opening 811 having sidewalls 811a and 811b that are slanted with respect to the Z-axis, according to an example. For completeness, the Z-axis is substantially perpendicular to the X-axis and the Y-axis introduced earlier above. According to another example, sidewalls 811a and 811b may be parallel and opposite to each other (not shown). Yet in another example, sidewalls 811a and 811b may have a curved geometry.

LTE plate 810 further includes one or more gas channels that terminate at openings (discussed below with respect to FIG. 8B) on sidewalls 811a and 811b, according to an example. Supplying and extracting of purge gas through openings on sidewalls 811a and 811b, respectively, may create a gas flow pattern 824 that may be similar to gas flow pattern 424, as described with respect to FIG. 4A. In addition, LTE plate 810 may include one or more gas supply paths (not shown) to direct conditioned gas supplied from gas system 450 along direction 870. The flow of conditioned gas along direction 870 may block non-conditioned gas from entering open areas between the bottom surface of LTE plate 810 and support system 875. It should be noted that arrows 422 and 870 illustrate directions of gas flow and do not represent the number of gas supply paths running through LTE plate 810.

According to an example of this embodiment, optical element 818 may be similar to optical element 618 in function, as described with respect to FIG. 6. Optical element 818 may be positioned in the LTE within an opening 811 along an optical path between lens top 208 and an illumination system such as those described with respect to FIGS. 1A, 1B, and 2. Support and positioning of optical element 818 in the LTE may be provided by support system 875 that may be positioned between movable stage 401 and lens top 208. Optical element 818 is configured to be transmissive to radiation from the illumination system and is mounted in support system 875 in such a way that radiation from the illumination system can be transmitted to lens top 208 through optical element 818, according to an example of this embodiment.

FIG. 8B illustrates a top view of LTE plate 810, according to an embodiment. As discussed above, LTE plate 810 may include openings on sidewalls 811a and 811b. These openings may be arranged in substantially linear arrays 877 and 888 on sidewalls 811a and 811b, respectively. In an example of this embodiment, the openings of linear array 877 may be configured as gas outlets for introducing conditioned gas into the LTE and the openings of linear array 888 may be configured as gas inlets for extracting conditioned or non-conditioned gas from LTE.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
   an illumination system configured to condition a radiation beam;
   a movable stage comprising a support structure configured to support a patterning device, the patterning device being configured to impart the radiation beam with a pattern in its cross-section to form a patterned radiation beam;
   a projection system configured to project the patterned radiation beam onto a target portion of a substrate; and
   a plate, positioned between the movable stage and the projection system, comprising:
      first and second surfaces, the second surface being substantially parallel to and opposite to the first surface, and
      an opening surrounded by a plurality of sidewalls of the plate,
   wherein the plate is configured to supply and extract gas through first and second sidewalls of the plurality of sidewalls, respectively, to provide a first gas flow pattern, within a region between the movable stage and the projection system, substantially perpendicular to an optical axis of the illumination system,
   wherein a lateral dimension of the plate is smaller than a lateral dimension of the support structure.

2. The lithographic apparatus of claim 1, wherein the plate is further configured to provide a second gas flow pattern along a non-scanning direction of the moveable stage.

3. The lithographic apparatus of claim 1, wherein geometries of the first and second sidewalls are configured to allow the first gas flow pattern to be substantially perpendicular to the optical axis of the illumination system.

4. The lithographic apparatus of claim 1, wherein the first sidewall is substantially parallel and opposite to the second sidewall.

5. The lithographic apparatus of claim 1, wherein the first and second sidewalls are opposite to each other and are slanted with respect to a vertical axis.

6. The lithographic apparatus of claim 1, wherein the opening of the plate provides an optical path between the illumination system and the projection system.

7. The lithographic apparatus of claim 1, wherein the plate is further configured to provide a path for supply gas to be introduced into a region between the plate and the movable stage.

8. The lithographic apparatus of claim 1, wherein:
the plate is further configured to provide a path for supply gas to be introduced into a region between the plate and a support system; and
the support system is configured to hold an optical element within the opening of the plate.

9. The lithographic apparatus of claim 1, wherein the plate is further configured to provide a path for non-conditioned gas to be extracted from a region between the plate and the movable stage.

10. The lithographic apparatus of claim 1, wherein:
the plate comprises channels running through the plate;
at least one of the channels is configured to terminate at a first orifice along the first sidewall; and
at least another one of the channels is configured to terminate at a second orifice along the second sidewall.

11. The lithographic apparatus of claim 1, wherein the plate comprises an array of gas inlet openings or gas outlet openings on the first surface of the plate.

12. The lithographic apparatus of claim 1, wherein the plate comprises an array of gas outlets, on the first surface of the plate, coupled to a gas knife system via supply paths running through the plate.

13. The lithographic apparatus of claim 1, wherein:
the plate comprises a V-shaped array of gas inlet openings or gas outlet openings on the first surface of the plate;
an apex of the V-shaped array is pointed away from the opening; and
a line of symmetry of the V-shaped array is substantially aligned with a line of symmetry of the opening and a scanning direction of the movable stage.

14. The lithographic apparatus of claim 1, wherein:
the plate comprises a linear array of gas inlet openings or gas outlet openings on the first surface of the plate and along a side of the opening; and
the linear array is substantially aligned with a scanning direction of the movable stage.

15. The lithographic apparatus of claim 1, wherein:
the plate comprises:
a first linear array of gas outlet openings on the first sidewall, and
a second linear array of gas inlet openings on the second sidewall; and
the first and second linear arrays are substantially aligned with a non-scanning direction of the movable stage.

16. The lithographic apparatus of claim 15, wherein the non-scanning direction is a direction perpendicular to a scanning direction of the movable stage.

17. The lithographic apparatus of claim 1, wherein:
the plate comprises a fluid channel running through the plate; and
the fluid channel is configured to carry a thermally conditioned fluid for temperature regulation of the plate.

18. The lithographic apparatus of claim 1, further comprising an optical element positioned within the opening of the plate.

19. The lithographic apparatus of claim 18, wherein sidewalls of the optical element are in substantial contact with sidewalls of the opening of the plate.

20. The lithographic apparatus of claim 18, wherein the optical element is coupled to the projection system.

21. The lithographic apparatus of claim 1, further comprising:
an optical element; and
a support system configured to hold and position the optical element within the opening of the plate.

22. The lithographic apparatus of claim 1, further comprising an optical element positioned within the opening of the plate and configured to at least partially block the opening, the optical element being transmissive to the patterned radiation beam.

23. The lithographic apparatus of claim 1, further comprising:
an optical element positioned within the opening of the plate; and
a slit reducer positioned within the opening of the plate.

24. A lithographic apparatus comprising:
a movable stage comprising a support structure configured to support a patterning device, the patterning device being configured to impart a radiation beam with a pattern in its cross-section to form a patterned radiation beam;
a projection system configured to project the patterned radiation beam onto a target portion of a substrate; and
a plate positioned, between the movable stage and the projection system, comprising an opening surrounded by a plurality of sidewalls of the plate, the opening being configured to provide an optical path between an illumination system and the projection system,
wherein the plate is configured to supply and extract gas through respective opposing sidewalls of the plurality of sidewalls to provide a first gas flow pattern, within the opening, that is substantially perpendicular to an optical axis of the illumination system,
wherein a lateral dimension of the plate is smaller than a lateral dimension of the support structure.

25. The lithographic apparatus of claim 24, wherein the plate further comprises a V-shaped array of gas inlet openings or gas outlet openings on a surface of the plate.

26. The lithographic apparatus of claim 24, wherein the plate is further configured to provide a second gas flow pattern along a non-scanning direction of the moveable stage.

27. The lithographic apparatus of claim 24, wherein:
the movable stage is configured to move the support structure along a first plane; and
the plate is located in a second plane substantially parallel to the first plane.

28. The lithographic apparatus of claim 24, wherein the plate is further configured to provide a path for supply gas to be introduced into a region between the plate and the movable stage.

29. The lithographic apparatus of claim 24, wherein the plate is further configured to provide a path for non-conditioned gas to be extracted from a region between the plate and the movable stage.

30. The lithographic apparatus of claim 24, further comprising an optical element positioned within the opening of the plate.

31. The lithographic apparatus of claim 30, wherein sidewalls of the optical element are in substantial contact with sidewalls of the opening of the plate.

32. The lithographic apparatus of claim 30, wherein the optical element is coupled to the projection system.

33. The lithographic apparatus of claim 24, further comprising an optical element positioned within the opening of the plate and configured to at least partially block the opening, the optical element being transmissive to the patterned radiation beam.

34. A lithographic apparatus comprising:
a movable stage comprising a support structure configured to support a patterning device, the patterning device being configured to impart a radiation beam with a pattern in its cross-section to form a patterned radiation beam;
a projection system configured to project the patterned radiation beam onto a target portion of a substrate; and
a plate, positioned between the movable stage and the projection system, comprising an opening within the plate surrounded by inner sidewalls of the plate,
wherein the plate is configured to supply and extract gas through respective opposing sidewalls of the inner sidewalls of the plate to provide a gas flow into a region between the plate and the movable stage in order to prevent external gas from entering the region,
wherein a lateral dimension of the plate is smaller than a lateral dimension of the support structure.

35. The lithographic apparatus of claim 34, wherein:
the plate is further configured to produce a gas flow pattern in a region between the movable stage and the projection system; and
the gas flow pattern is substantially perpendicular to an optical axis of an illumination system.

36. The lithographic apparatus of claim 34, wherein the plate is further configured to provide a gas flow pattern along a non-scanning direction of the moveable stage.

37. The lithographic apparatus of claim 34, wherein:
the plate is further configured to produce a gas flow pattern between the opposing sidewalls; and
the gas flow pattern is substantially perpendicular to an optical axis of an illumination system.

38. The lithographic apparatus of claim 34, further comprising an optical element positioned within the opening of the plate and configured to at least partially block the opening, the optical element being transmissive to the patterned radiation beam.

* * * * *